(12) United States Patent
Cordero et al.

(10) Patent No.: US 9,418,722 B2
(45) Date of Patent: Aug. 16, 2016

(54) PRIORITIZING REFRESHES IN A MEMORY DEVICE

(71) Applicant: International Business Machines Corporation, Armonk, NY (US)

(72) Inventors: Edgar R. Cordero, Round Rock, TX (US); Joab D. Henderson, Pflugerville, TX (US); Kyu-hyoun Kim, Mount Kisco, NY (US); Jeffrey A. Sabrowski, Leander, TX (US); Anuwat Saetow, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/878,174

(22) Filed: Oct. 8, 2015

(65) Prior Publication Data
US 2016/0027494 A1  Jan. 28, 2016

Related U.S. Application Data

(62) Division of application No. 13/889,649, filed on May 8, 2013, now Pat. No. 9,245,604.

(51) Int. Cl.
*G11C 11/406* (2006.01)
*G11C 7/24* (2006.01)
*G11C 11/4076* (2006.01)
*G11C 11/403* (2006.01)

(52) U.S. Cl.
CPC ............... *G11C 11/406* (2013.01); *G11C 7/24* (2013.01); *G11C 11/4076* (2013.01); *G11C 11/40603* (2013.01); *G11C 11/403* (2013.01)

(58) Field of Classification Search
CPC .. G11C 7/24; G11C 11/40603; G11C 11/406; G11C 11/40615; G11C 11/40611; G11C 2211/4068; G11C 11/40622; G11C 2211/4065; G11C 16/3418
See application file for complete search history.

(56) References Cited

U.S. PATENT DOCUMENTS

| 5,495,452 | A | 2/1996 | Cha |
| 5,717,644 | A | 2/1998 | Hadderman et al. |
| 5,737,271 | A | 4/1998 | Ting et al. |
| 6,097,649 | A | 8/2000 | Chiang et al. |

(Continued)

FOREIGN PATENT DOCUMENTS

JP  2005332497  12/2005

OTHER PUBLICATIONS

Nyathi, J. et al., "Self-Timed Refreshing Approach for Dynamic Memories", ASIC Conference Proceedings, 11th Annual IEEE International, 1998. pp. 169-173. http://ieeexplore.ieee.org/stamp/stamp.jsp?tp=&arnumber=722887.

(Continued)

*Primary Examiner* — Richard Elms
*Assistant Examiner* — Ajay Ojha
(74) *Attorney, Agent, or Firm* — Michael O'Keefe; Robert R. Williams

(57) ABSTRACT

A method and apparatus for refreshing a row of a memory device prior to a scheduled refresh. A memory array may include a plurality of memory cells. The memory array may be configured to be refreshed at a first refresh time interval. The memory device may also include an intermediate refresh circuit. The intermediate refresh circuit may be configured to detect a triggering event and request a refresh for a row of the memory array in response to detecting a triggering event.

11 Claims, 8 Drawing Sheets

(56) References Cited

U.S. PATENT DOCUMENTS

| | | |
|---|---|---|
| 6,714,469 B2 | 3/2004 | Rickes et al. |
| 6,778,457 B1 | 8/2004 | Burgan |
| 7,142,473 B2 | 11/2006 | Ogiwara et al. |
| 7,272,065 B2 | 9/2007 | Lovett |
| 7,304,881 B2 | 12/2007 | Rodriguez et al. |
| 7,359,247 B2 | 4/2008 | Motoki |
| 7,440,353 B2 | 10/2008 | Kim et al. |
| 7,495,955 B2 | 2/2009 | Ido |
| 7,813,205 B2 | 10/2010 | Sako |
| 7,903,479 B2 | 3/2011 | Im |
| 8,111,574 B2 | 2/2012 | Kim |
| 8,310,858 B2 | 11/2012 | Ito |
| 8,634,225 B2 | 1/2014 | Kang |
| 8,737,120 B2 | 5/2014 | Guo et al. |
| 2005/0281112 A1* | 12/2005 | Ito .................. G11C 11/406 365/222 |
| 2007/0171753 A1 | 7/2007 | Morgan et al. |
| 2011/0051495 A1 | 3/2011 | Ito |
| 2011/0128774 A1 | 6/2011 | Maejima |
| 2011/0157962 A1 | 6/2011 | McElroy et al. |
| 2011/0286288 A1 | 11/2011 | Mutnury et al. |
| 2012/0039133 A1 | 2/2012 | Kadowaki |
| 2013/0304982 A1 | 11/2013 | Jung et al. |
| 2014/0085995 A1 | 3/2014 | Greenfield et al. |
| 2014/0334224 A1 | 11/2014 | Cordero et al. |
| 2014/0334225 A1 | 11/2014 | Cordero et al. |
| 2015/0228328 A1 | 8/2015 | Cordero et al. |

OTHER PUBLICATIONS

Scheuerlein, R., et al., "A Pulsed Sensing Scheme with a Limited Bit-Line Swing", IEEE Journal of Solid-State Circuits. vol. 27, No. 4, Apr. 1992. pp. 678-682. http://ieeexplore.ieee.org/stamp/stamp.jsp?tp=&arnumber=126563.

* cited by examiner

| Refresh Queue | High-Priority Groups | Group Refreshed |
|---|---|---|
| [1, 2, 3, 4] | None | 1 |
| [2, 3, 4, 5] | 4 | 2, 4(a, b) |
| [3, 4, 5, 6] | 7 | 3, 7(c, d) |
| [4, 5, 6, 7] | None | 4 |
| [5, 6, 7, 8] | None | 5 |
| [6, 7, 8, 1] | 1 | 6, 1(e, f) |
| [7, 8, 1, 2] | None | 7 |
| [8, 1, 2, 3] | None | 8 |

FIG. 8

PRIORITIZING REFRESHES IN A MEMORY DEVICE

FIELD

This disclosure generally relates to memory devices, and in particular, to prioritizing a refresh for a row of a memory array in a dynamic random access memory (DRAM).

BACKGROUND

A dynamic random access memory (DRAM) stores a bit of data on a capacitor in a DRAM cell. The capacitor loses its charge over time and must be periodically refreshed. The frequency with which a particular capacitor needs to be refreshed depends on the construction and manufacture of the chip. As devices continue to decrease in size, a DRAM cell may become discharged when its neighbor is accessed repeatedly in a short amount of time. Repeatedly accessing a row of the DRAM is sometimes referred to as row hammering. This behavior could lead to a loss of data in the affected DRAM cell. If, however, the affected cell is refreshed prior to losing its data, the cell will regain its charge and take a large number of accesses by its neighbor in order to be affected again. Conversely, if the affected cell is refreshed after losing its data, uncorrectable errors may occur.

SUMMARY

Embodiments of the disclosure provide a method and apparatus for refreshing a row of a memory device prior to a scheduled refresh.

In one embodiment, a memory device including a memory array is described. The memory array may include a plurality of memory cells. The memory array may be configured to be refreshed at a first refresh time interval. The memory device may also include an intermediate refresh circuit. The intermediate refresh circuit may be configured to detect a triggering event and request a refresh for a row of the memory array in response to detecting a triggering event.

Another embodiment describes a method to request a refresh for a specific row of a memory array in a memory device.

BRIEF DESCRIPTION OF THE DRAWINGS

FIG. 8 illustrates a sample refresh table including a refresh queue, high-priority groups, and the group refreshed in a cycle, according to an embodiment.

Like reference numbers and designations in the various drawings indicate like elements.

DETAILED DESCRIPTION

Dynamic random access memory (DRAM) is made up of cells, referred to in this Specification as DRAM cells, which include a capacitor and a transistor. The capacitor in a DRAM cell may store a charge representing a bit of data. DRAM cells may leak charge over time. Accordingly, the DRAM must be periodically refreshed to prevent data loss caused by the charge leakage.

A DRAM cell may become discharged when its neighbor is accessed repeatedly in a short amount of time. This behavior could lead to data loss of the affected DRAM cell. Consistent with embodiments of the present disclosure, a high priority refresh for a row of DRAM cells may be requested between its normal refresh cycles. This may similarly be referred to as an intermediate refresh. That is, if a refresh for a row is scheduled every 64 milliseconds, a high priority refresh may cause the row to be refreshed before the 64-millisecond period is complete. In some embodiments, a particular row may only receive one high priority refresh request per refresh cycle to prevent delaying refreshes to other rows. Requesting a high priority refresh for a particular row of DRAM cells may ensure that when a DRAM cell is accessed, the correct value is read even though the DRAM cell has leaked some of its charge. The DRAM cell may, in some embodiments, leak charge because of the transistor, while in other embodiments the dielectric in the capacitor may cause the charge leakage. In some embodiments, the high priority refresh may be based on one or more accesses to neighboring (adjacent) rows of the DRAM array.

Figure 1:
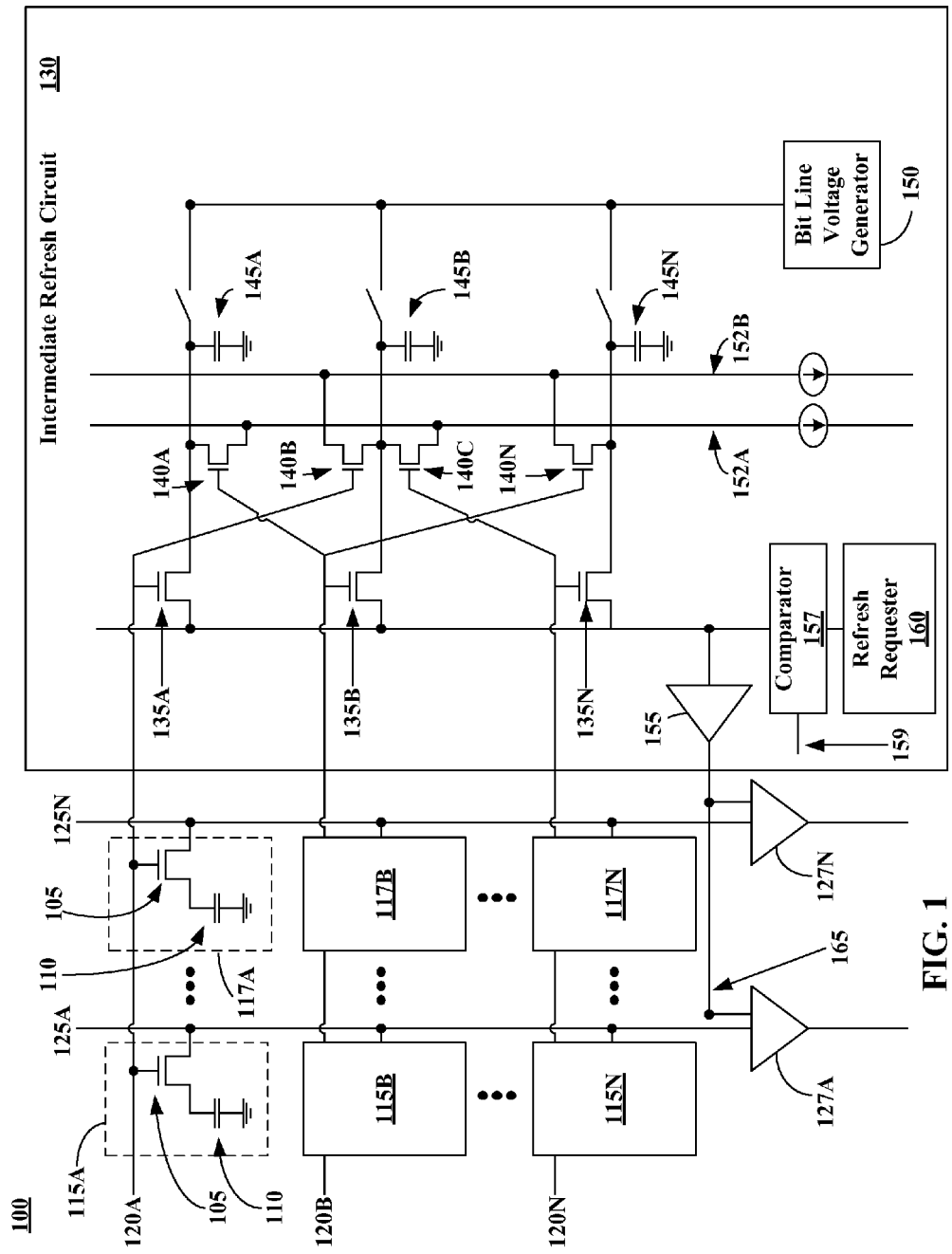
FIG. 1 illustrates a dynamic random access memory (DRAM) including a first embodiment of a prioritized refresh circuit.

FIG. 1 illustrates a first embodiment of a DRAM 100 including an intermediate refresh circuit, e.g., intermediate refresh circuit 130. The DRAM 100 illustrates the intermediate refresh circuit that may request a refresh for a particular row of a DRAM array in between the normal refresh cycle for the row. In some embodiments, requesting an intermediate refresh for a particular row of a DRAM array may prevent loss of data due to leakage of the DRAM cell.

The DRAM 100 includes a plurality of DRAM cells 115A-115N, 117A-117N, generically referred to in this Detailed Description as the DRAM cells 115 and DRAM cells 117. Each of the DRAM cells 115 and 117 includes one transistor 105 and one capacitor 110. The capacitor 110 may be charged or discharged to represent either a 1 or a 0. The DRAM 100 is arranged in an array of DRAM cells 115 and 117. Word lines 120A-120N, generically referred to in this Detailed Description as word lines 120, connect each row. Bit lines 125A-125N, generically referred to in this Detailed Description as bit lines 125, connect each column of the array of DRAM cells 115, 117. The array of DRAM cells 115, 117 including word lines 120 and bit lines 125 are exemplary and may include additional DRAM cells 115, 117, word lines 120, and bit lines 125. Sense amplifiers 127A-127N, generically referred to in this Detailed Description as sense amplifiers 127, correspond to each of the bit lines 125. The sense amplifiers 127 may be used to compare a reference voltage with the voltage of a capacitor, e.g., capacitor 110, of one of the DRAM cells 115, 117 to determine whether the capacitor 110 is storing a 1 or a 0. An intermediate refresh circuit 130 may request a high priority refresh of a particular row, e.g., the row corresponding to word line 120B, of a DRAM array.

The intermediate refresh circuit 130 may include transistors 135A-135N, generically referred to in this Detailed Description as transistors 135, negative channel field-effect transistors (NFETs) 140A-140N, generically referred to in this Detailed Description as NFETs 140, tank capacitors 145A-145N, a bit line voltage generator 150, two current sources 152A and 152B, a unity gain buffer 155, a comparator 157, and a refresh requester 160. The unity gain buffer 155 may provide the same voltage as the analog input voltage. The intermediate refresh circuit 130 may request a refresh of a specific row via the refresh requester 160. The reference voltage line 165 may provide a nominal reference voltage or a modified reference voltage, according to various embodiments. In the illustrated embodiment, the current sources 152A and 152B and the bit line voltage generator 150 are shown on a per chip basis for the DRAM 100. In other embodiments, the bit line voltage generator 150 and the current sources 152A and 152B may be implemented on a per row group basis. That is, there could be individual current sources and bit line voltage generators for groups of rows in the DRAM 100.

Each word line 120 is coupled to a transistor 135, at least one NFET 140, and a tank capacitor 145. In some embodiments, the NFET 140 may be implemented using a positive channel field-effect transistor (PFET) instead. For example, word line 120B is coupled to transistor 135B, NFETs 140A and 140N, and tank capacitor 145N. The remaining word lines 120 are configured the same as or similar to the word line 120B. The intermediate refresh circuit 130 may account for charge leakage that occurs due to a large number of row accesses on an adjacent row. For example, if word line 120A is accessed a large number of times in a short period of time, e.g., between refresh cycles, the DRAM cells 115 and 117 connected to word line 120B may leak more charge than if no accesses occurred to word line 120A. Accordingly, when accessing a DRAM cell 115 or 117 connected to word line 120B, the reference voltage may not be the correct value for interpreting the value stored in the DRAM cells 115 and 117, and a high priority refresh request may be generated to decrease the refresh cycle time for the particular row.

The intermediate refresh circuit 130 may be configured to request a high priority refresh for a particular row of the DRAM array via the refresh requester 160. When a row is accessed, the capacitors 145 may be charged using the bit line voltage generator 150 to a nominal reference voltage. When a row is accessed, e.g., word line 120B, the NFETs 140 for the adjacent rows to which that word line is connected will allow for some charge to be drained from the corresponding capacitor. For example, when word line 120B is accessed, then NFETs 140A and 140N would allow some charge to drain from capacitors 145A and 145N. Accordingly, when the word line 120B is used to access the corresponding row of DRAM cells, e.g., 115B, 117B, the transistor 135B will allow for the charge in the capacitor 145B (which may have a corresponding voltage that is reduced from the nominal reference voltage) to flow through the unity gain buffer 155 to sense amplifiers 127. Accordingly, the reference voltage supplied to the sense amplifiers 127 via the reference voltage line 165 may be the nominal reference voltage (if no adjacent rows of the memory array have been accessed), or a modified reference voltage, if rows adjacent to the row being accessed have been accessed as well.

In various embodiments, when a row, e.g., word line 120B, is accessed, the charge flowing to the unity gain buffer 155 may also be provided to a comparator 157. The comparator 157 may also have a voltage threshold line 159 as an input. The voltage threshold line 159 may provide a reference voltage against which the comparator 157 can compare to determine whether to request a high priority refresh. If the voltage read from one of the capacitors 145, e.g., capacitor 145B when accessing word line 120B, is outside the voltage on the voltage threshold line 159, then the refresh requester 160 may provide a high priority refresh request for the row being read. If, however, the voltage read from one of the capacitors 145, e.g., capacitor 145B when accessing word line 120B, is within the voltage on the voltage threshold line 159, then no action may be taken by the refresh requester 160. In some embodiments, the voltage provided on the voltage threshold line 159 may be less than half of Vdd.

Figure 2:
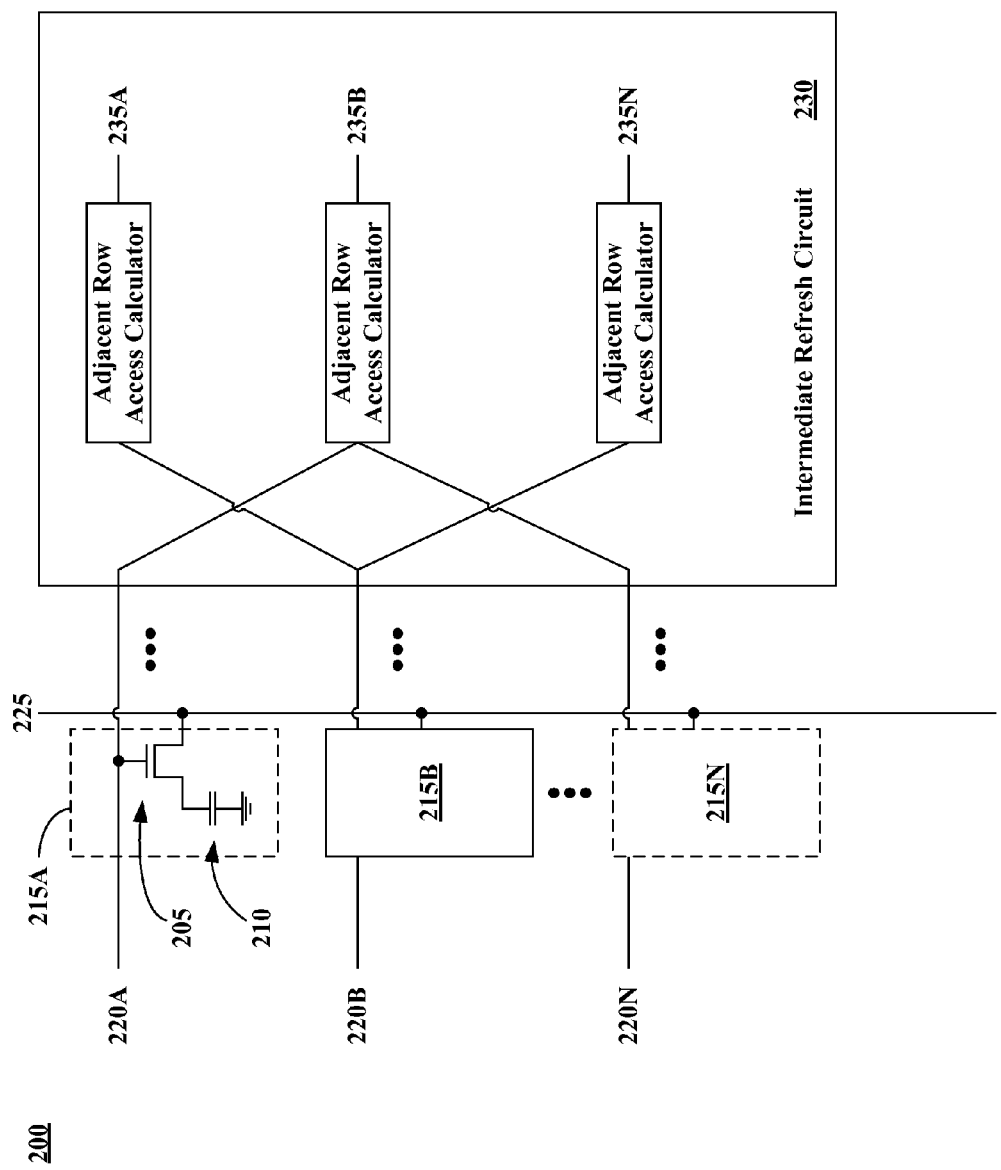
FIG. 2 illustrates a DRAM including a second embodiment of a prioritized refresh circuit.

FIG. 2 illustrates a second embodiment of a DRAM 200 including an intermediate refresh circuit, e.g., intermediate refresh circuit 230. The DRAM 200 illustrates the intermediate refresh circuit that may request a high priority refresh for a particular row of a DRAM array in between the normal refresh cycle for the row. In some embodiments, requesting a high priority refresh for a particular row of a DRAM array may prevent loss of data due to leakage of the DRAM cell.

The DRAM 200 includes a plurality of DRAM cells 215A-215N, generically referred to in this Detailed Description as DRAM cells 215. Each of the DRAM cells 215 includes one transistor 205 and one capacitor 210. The capacitor 210 may be charged or discharged to represent either a 1 or a 0. The DRAM 200 is arranged in an array of DRAM cells 215. Word lines 220A-220N, generically referred to in this Detailed Description as word lines 220, connect each row. Bit lines, e.g., bit line 225, connect each column of the DRAM cells 215. The array of DRAM cells 215 including word lines 220 and bit lines 225 are exemplary and may include additional DRAM cells 215, word lines 220, and bit lines 225. A high priority refresh circuit 230 may request a high priority refresh of a particular row, e.g., the row corresponding to word line 220B, of a DRAM array.

The intermediate refresh circuit 230 includes adjacent row access calculators 235A-235N, generically referred to in this Detailed Description as the adjacent row access calculators 235. The adjacent row access calculators 235 may be configured to calculate how susceptible a row is to losing its cell contents whenever an adjacent row is accessed. For example, every time the row connected to word line 220B is accessed the logic of adjacent row access calculators 235A and 235N are accessed. When a threshold is reached, a high priority refresh may be requested for the corresponding row. The logic of the adjacent row access calculator 235B is described in additional detail in accordance with FIG. 3 below.

Figure 3:
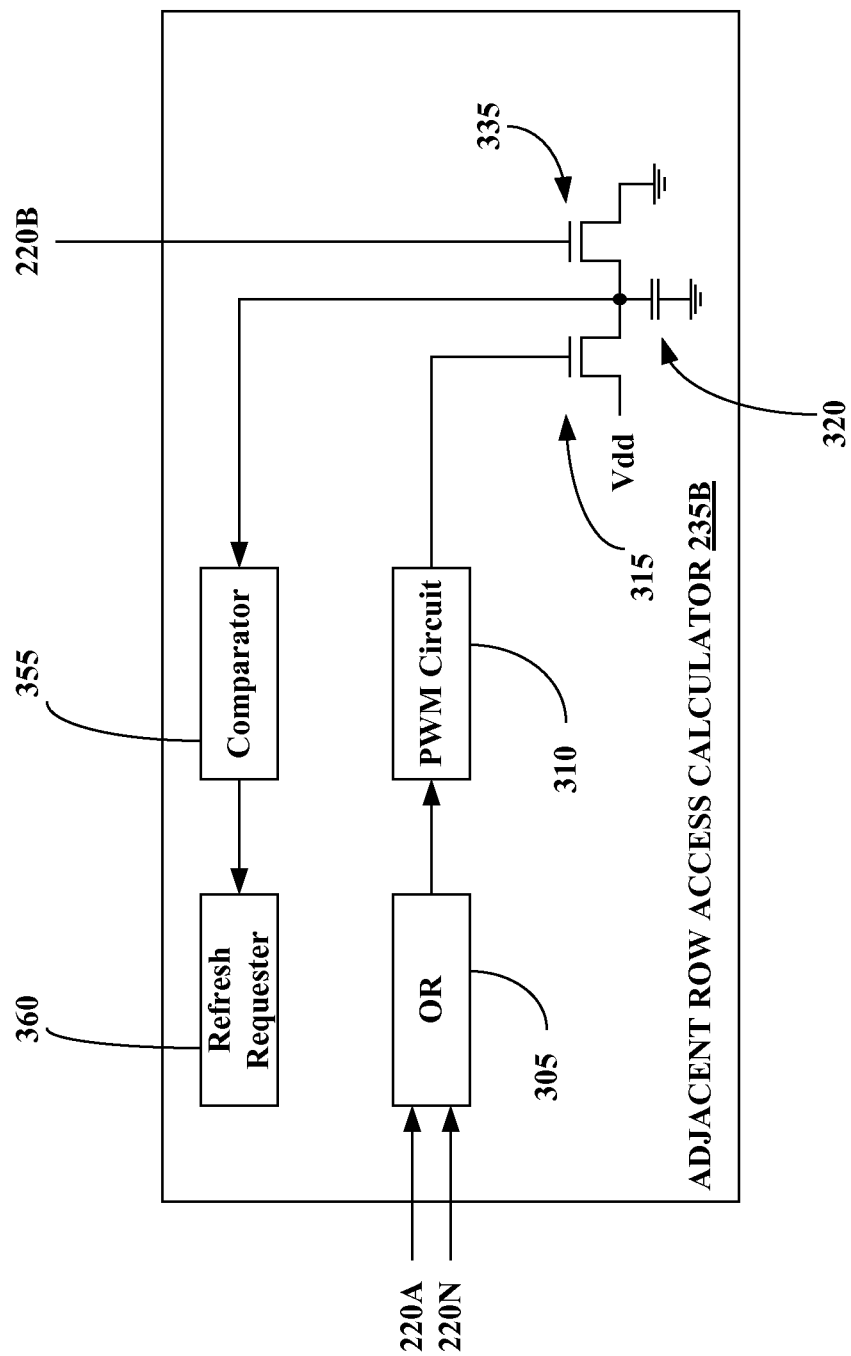
FIG. 3 illustrates a more detailed view of the adjacent row access calculator of FIG. 2, according to various embodiments.

FIG. 3 illustrates a more detailed view of the adjacent row access calculator 235B of FIG. 2, according to various embodiments. The adjacent row access calculator 235B is illustrative and may be the same as or similar to the adjacent row access calculators 235A and 235N. An OR gate 305 may receive a charge from either word line 220A or 220N, and send the charge to a pulse width modulation circuit 310 when a row of the DRAM array connected to either word line 220A or 220N is accessed. The pulse width modulation circuit 310 may send some charge through the transistor 315 to a storage capacitor 320. The amount of the charge applied to the storage capacitor 320 from the pulse width modulation circuit 310 may be based on the rate of change of the charge in a capacitor, e.g., capacitor 210 (FIG. 2), in the corresponding DRAM cells 215, according to some embodiments. The comparator 355 may determine whether the charge of the storage capacitor 320 is outside a threshold. If the charge of the storage capacitor 320 is outside the threshold, then the refresh requester 360 may send a high priority refresh request to refresh the word line 220B. If, however, the charge of the storage capacitor 320 is within the threshold, then the refresh requester 360 may take no action. When one of the DRAM cells 215 connected to the word line 220B is accessed, then the charge supplied to the transistor 335 will bring the charge of the storage capacitor 320 back to ground.

Figure 4:
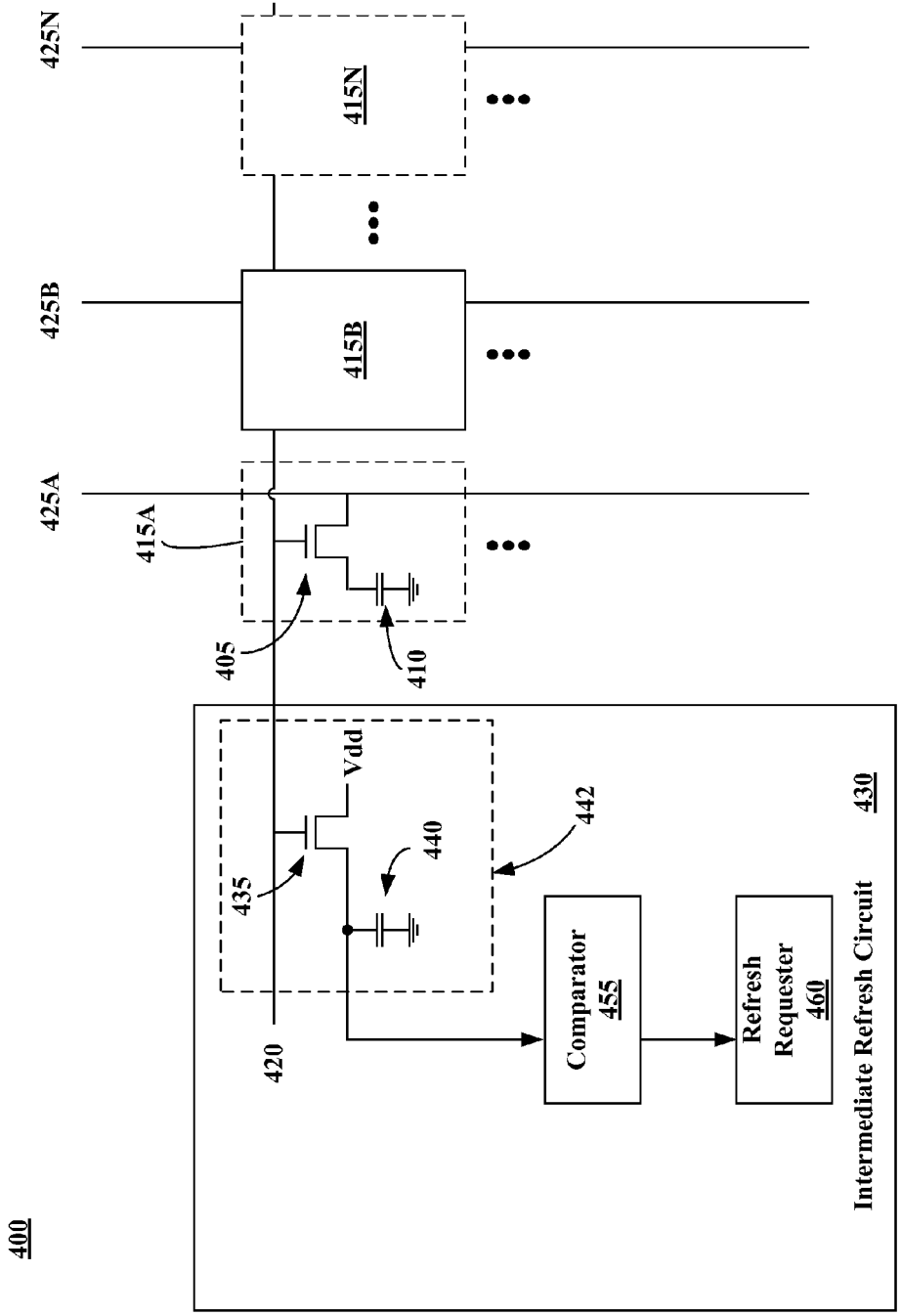
FIG. 4 illustrates a DRAM including a third embodiment of a prioritized refresh circuit.

FIG. 4 illustrates a third embodiment of a DRAM 400 including an intermediate refresh circuit, e.g., intermediate refresh circuit 430. The DRAM 400 illustrates an intermediate refresh circuit that may request a high priority refresh for a particular row of a DRAM array. In some embodiments, requesting a high priority refresh for a particular row of a DRAM array may prevent loss of data due to leakage of the DRAM cell.

The DRAM 400 includes a plurality of DRAM cells 415A-415N, generically referred to in this Detailed Description as DRAM cells 415. Each of the DRAM cells 415 includes one transistor 405 and one capacitor 410. The capacitor 410 may be either charged or discharged to represent either a 1 or a 0. The DRAM 400 is arranged in an array of DRAM cells 415. Word line 420 connects each row. Bit lines 425A-425N, generically referred to in this Detailed Description as bit lines 425, connect each column of the array of DRAM cells 415. The array of DRAM cells 415 including word line 420 and bit lines 425 is exemplary and may include additional DRAM cells 415, word lines 420, and bit lines 425. An intermediate refresh circuit 430 may request a high priority refresh of a particular row of a DRAM array.

The intermediate refresh circuit 430 may include a leaky cell 442 including a transistor 435 and a capacitor 440, a comparator 455, and a refresh requester 460, according to various embodiments. The leaky cell 442 may leak charge more quickly than the DRAM cells 415. In some embodiments, the leaky cell 442 may leak charge more quickly than the DRAM cells 415 because of the design of the transistor 435. In other embodiments, the capacitor 440 may be designed to cause the leaky cell 442 to leak charge quicker than the DRAM cells 415. When a row is accessed or refreshed, e.g., the row connected to word line 420, the capacitor 440 may be charged. Because leaky cell 442 leaks charge at a rate that is more rapid than the DRAM cells 415, the leaky cell 442 may reach a threshold charge, indicating that the row may need to be refreshed in order to prevent a loss of data stored in one of the DRAM cells 415.

The comparator 455 may determine whether the charge in the leaky cell 442 is outside the threshold charge. If the charge in the leaky cell 442 is outside the threshold charge then the refresh requester 460 may request a high priority refresh of the particular row. If, however, the charge in the leaky cell 442 falls within the threshold then the refresh requester 460 may take no action.

Figure 5:
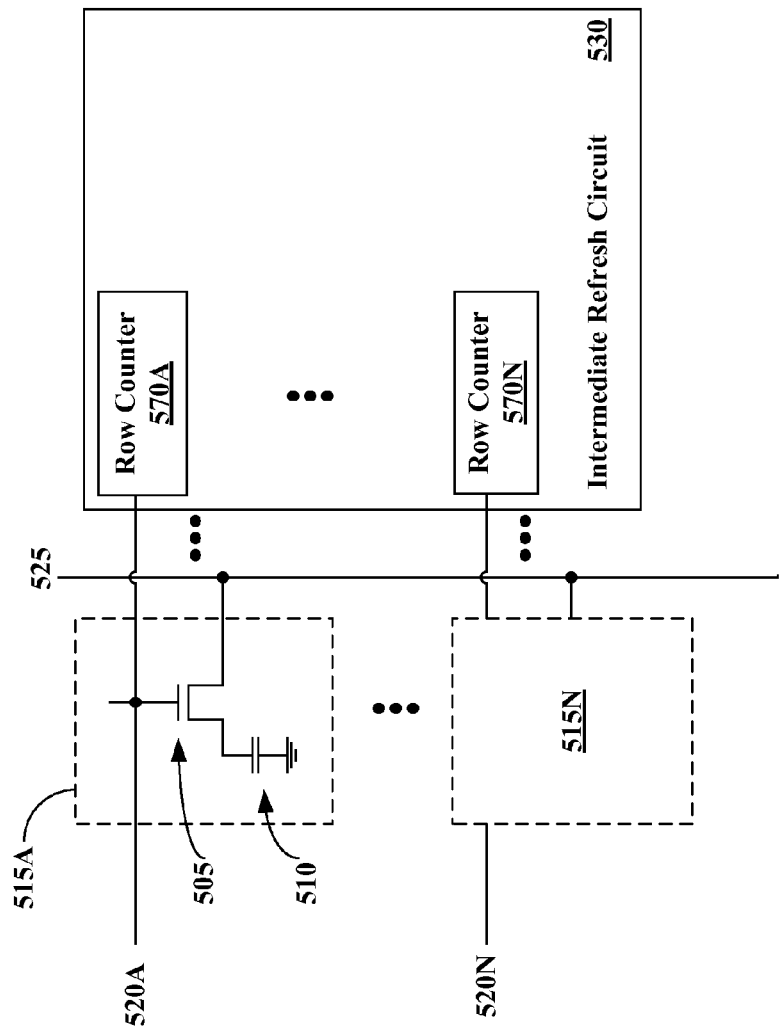
FIG. 5 illustrates a DRAM including a fourth embodiment of a prioritized refresh circuit.

FIG. 5 illustrates a fourth embodiment of a DRAM 500 including an intermediate refresh circuit, e.g., intermediate refresh circuit 530. The DRAM 500 illustrates an intermediate refresh circuit that may request a high priority refresh for a particular row of a DRAM array in between the normal refresh cycle for the row. In some embodiments, requesting a high priority refresh for a particular row of a DRAM array may prevent loss of data due to leakage of the DRAM cell.

The DRAM 500 includes a plurality of DRAM cells 515A-515N, generically referred to in this Detailed Description as DRAM cells 515. Each of the DRAM cells 515 includes one transistor 505 and one capacitor 510. The capacitor 510 may be charged or discharged to represent either a 1 or a 0. The DRAM 500 is arranged in an array of DRAM cells 515. Word lines 520A-520N, generically referred to in this Detailed Description as word lines 520, connect each row. Each row of the memory array contains a row counter, e.g., row counter 570A connected to word line 520A, configured to determine how much time has elapsed since the last refresh to the particular row. When a row is accessed or refreshed, the corresponding row counter may be reset. Though the row counters 570 are illustrated as being part of the DRAM 500, the row counters could reside in the logic chip of a through-silicon via (TSV) instead of on the DRAM 500 in other embodiments. Bit lines, such as bit line 525, connect each column of the array of DRAM cells 515. The array of DRAM cells 515 including word lines 520 and bit lines 525 are exemplary and may include additional DRAM cells 515, word lines 520, and bit lines 525. An intermediate refresh circuit 530 may request a high priority refresh of a particular row of the DRAM array when a time elapsed since the last refresh falls outside a threshold. The row counter 570A is described in further detail in accordance with FIG. 6 below.

Figure 6:
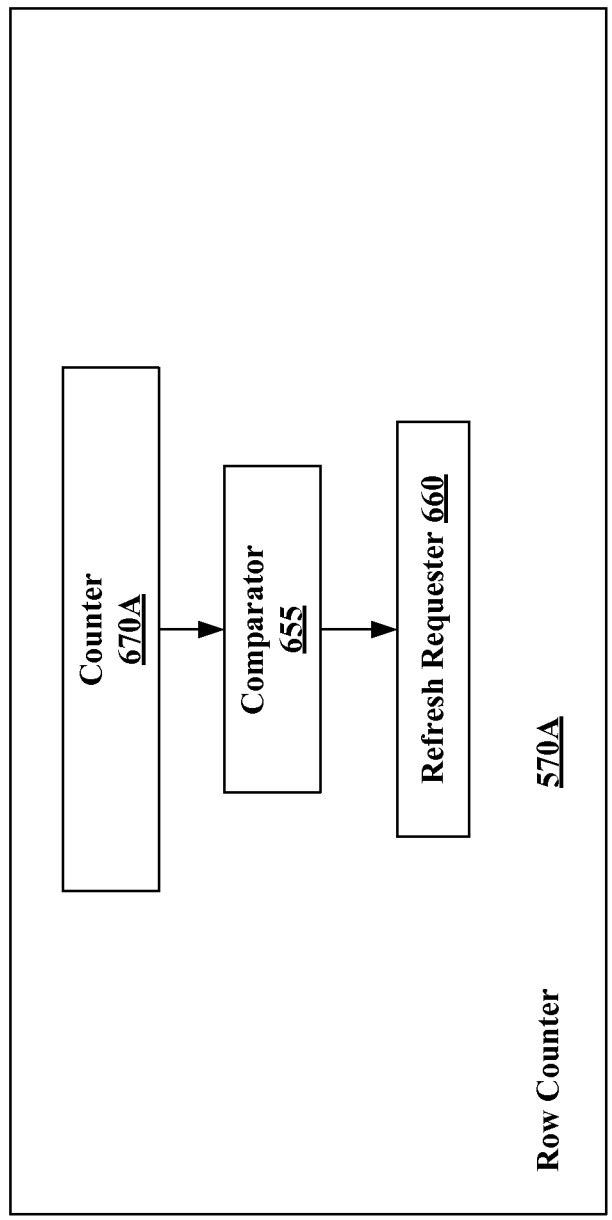
FIG. 6 illustrates a more detailed view of the row counter of FIG. 5, according to various embodiments.

FIG. 6 illustrates a more detailed view of the row counter 570A of FIG. 5, according to various embodiments. The row counter 570A is illustrative and may be the same as or similar to the row counter 570N. The row counter 570A may, in some embodiments, include a counter 670A, a comparator 655, and a refresh requester 660. The counter 670A may indicate how much time has elapsed since the particular row connected to word line 520A was last refreshed. The comparator 655 may determine whether the time that has elapsed since the last refresh to the particular row is outside a refresh time threshold. The "refresh time threshold," as referred to in this Specification, may include an amount of time that is less than the refresh cycle period. For example, if the refresh cycle period is 64 milliseconds, then the refresh time threshold may be a time period that is less than 64 milliseconds. In some embodiments, there may be multiple refresh time thresholds. If the time elapsed since the last refresh is determined to be outside the refresh time threshold, the refresh requester 660 may request a high priority refresh between the normal refresh cycles for the rows adjacent to this row. If, however, the time elapsed since the last refresh is within the refresh time threshold, then the refresh requester 660 may take no action.

Figure 7:
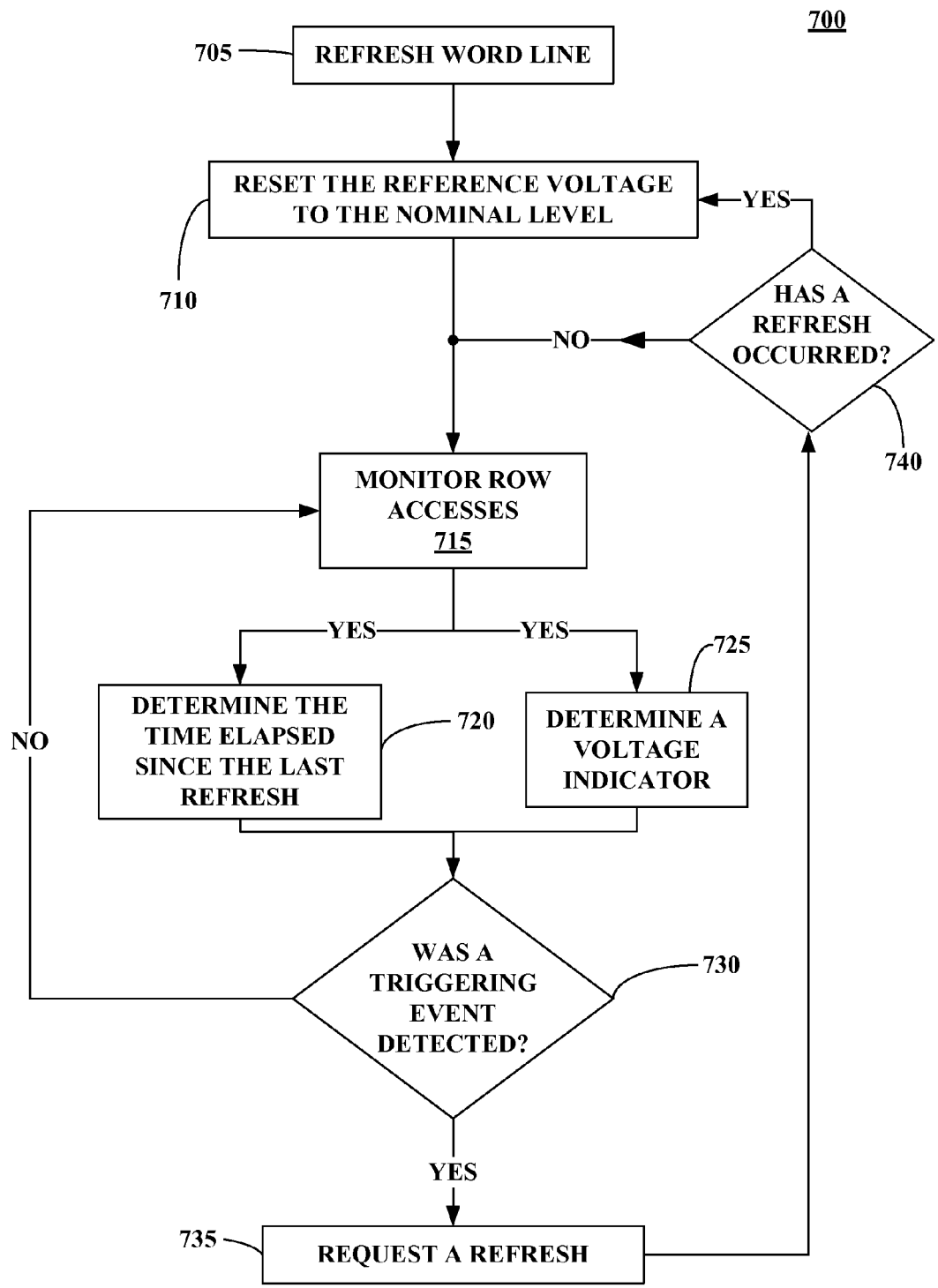
FIG. 7 illustrates a flowchart for a method to request an intermediate refresh for a particular row of a DRAM in between refreshes of a refresh cycle, according to various embodiments.

FIG. 7 illustrates a flowchart for a method 700 to request a high priority refresh for a particular row of a DRAM in between normal refreshes of a refresh cycle, according to various embodiments. In some embodiments, the method 700 may request a high priority refresh for a particular row of the DRAM array in between the normal refreshes of a refresh cycle, which may prevent the contents of the DRAM cells from being lost due to the charge leakage of the DRAM cells.

The method 700 may begin with operation 705, in which a row in a DRAM array is refreshed. Following the refresh of operation 705, one or more counters and/or voltage indicators may be reset to their initial values at operation 710. The one or more counters may be used to determine the time since the last refresh for a particular row. The one or more voltage indicators may be used to determine whether a voltage is outside a threshold and a refresh is needed to prevent a row from losing its data contents. At operation 715, the method 700 may monitor the row accesses for the DRAM array. This may include either or both of operations 720 and 725. Operation 720 may include determining the time elapsed since a row was last refreshed. In some embodiments, operation 720 may include one or more counters. Operation 725 may include determining a voltage indicator. The voltage indicator may indicate whether a refresh for a row is needed to prevent the DRAM cells in that row from losing their contents due to the leakage of the DRAM cells and may be a voltage that is modified when some action occurs. For example, the voltage indicator may be set to a nominal value upon a refresh and modified based on one or more accesses to adjacent rows in the DRAM array.

At operation 730, the method 700 may determine whether a triggering event was detected. A triggering event may be based on either adjacent row access activity or the time elapsed since the last refresh, according to various embodiments. If a triggering event was detected in operation 730, the method 700 may continue to operation 735 and request a high priority refresh of the row corresponding to the triggering event. If, however, a triggering event was not detected in operation 730, then the method may continue to monitor row accesses in the DRAM array at operation 715. Following operation 730, the method 700 may determine whether a refresh occurred in operation 740. If a refresh has not occurred, then the method 700 may continue to monitor the row accesses (operation 715) without resetting the one or more counters and/or voltage indicators. If a refresh has occurred, then the one or more counters and voltage indicators may be reset at operation 710.

FIG. 8 illustrates a sample refresh table 800 including a refresh queue 805, high-priority groups 810, and the group refreshed in a cycle 815, according to an embodiment. The refresh table 800 includes eight groups (1-8) of rows of a memory array in a memory device. The refresh queue 805 includes four groups that are in the queue to be refreshed for a subset of a particular refresh cycle. In some embodiments, the eight rows illustrated in the refresh table 800 may represent one refresh cycle. A refresh cycle may, for example, be completed every 64 milliseconds, according to various embodiments. For each phase of the refresh cycle, four groups of rows may be queued, with one group being refreshed in each phase. In some embodiments, the features described above may be used to mark one or more rows of a group as high priority. This may result in an intermediate refresh that occurs prior to the completion of the refresh cycle for that particular group.

The high-priority groups 810 column illustrates the phases in which a group gets marked as high priority. In some embodiments, if a group is marked as high priority, then the group refreshed may include the scheduled groups as well as the rows from the high-priority group that have been marked as needing an intermediate refresh. In the illustrated embodiment, the group refreshed, shown in 815, is the first group in the refresh queue 805. For example, in the first row, the refresh queue 805 includes groups 1-4, there are no groups marked high priority, and accordingly, the group refreshed is group 1 (shown in 815). In the second row, groups 2-5 are in the refresh queue 805 and group 4 is marked as high priority (shown in 810). Accordingly, group 2 is refreshed, and here, the one or more rows from group 4 that are marked as high priority will be refreshed as well, illustrated as 4(a, b). In some embodiments, there may be only one row that is refreshed. In some embodiments, the entire group may be refreshed as well.

While the Detailed Description may refer to specific types of transistors, logic gates, supply voltages, and the like, one skilled in the art may implement the same or similar functions using different transistors, logic gates, and supply voltages in alternative aspects as described and still accomplish the same purpose of this disclosure. For example, transistors may be PFETs or NFETs. Logic gates may be AND, OR, XOR, NOR, NAND, XNOR or inverters.

The terminology used in this Specification is for the purpose of describing particular embodiments only and is not intended to be limiting. The singular forms "a," "an," and "the" are intended to include the plural forms as well, unless the context clearly indicates otherwise. When used in this Specification, the terms "includes" and/or "including," specify the presence of the stated features, integers, steps, operations, elements, and/or components, but do not preclude the presence or addition of one or more other features, integers, steps, operations, elements, components, and/or groups thereof.

In the previous Detailed Description, reference was made to the accompanying drawings (where like numbers represent like elements), which form a part hereof, and in which is shown by way of illustration specific exemplary embodiments in which the embodiments may be practiced. These embodiments were described to enable those skilled in the art to practice the embodiments, but other embodiments may be utilized and logical, mechanical, electrical, and other changes may be made without departing from the scope of the present disclosure. In the previous Detailed Description, numerous specific details were set forth to provide a thorough understanding of embodiments. Embodiments, however, may be practiced without these specific details. In other instances, well-known circuits, structures, and techniques have not been shown in detail in order not to obscure embodiments.

Different instances of the word "embodiment" as used within this Specification may, but do not necessarily, refer to the same embodiment. While the foregoing is directed to exemplary embodiments, other and further embodiments of the disclosure may be devised without departing from the basic scope thereof, and the scope thereof is determined by the claims that follow.

What is claimed is:

1. A memory device comprising:
    a memory array including a plurality of memory cells, the memory array configured to be refreshed at a first refresh time interval; and
    an intermediate refresh circuit, the intermediate refresh circuit configured to detect a triggering event and request a refresh for a row of the memory array in response to detecting a triggering event,
    wherein the intermediate refresh circuit comprises:
    a field-effect transistor (FET);
    a current source configured to drain a tank capacitor, wherein a voltage of the tank capacitor corresponds to a reference voltage;
    a comparator configured to determine whether the voltage of the tank capacitor is outside a threshold; and
    a refresh requester configured to request the refresh in response to a determination of the comparator.

2. The memory device of claim 1, wherein the refresh for the row of the memory array is configured to occur at a second refresh time interval, the second refresh time interval being less than the first refresh time interval.

3. The memory device of claim 1, wherein the memory array includes a dynamic random access memory (DRAM) array.

4. The memory device of claim 1, wherein the FET is at least one of a positive channel field-effect transistor and a negative channel field-effect transistor.

5. The memory device of claim 1, wherein the intermediate refresh circuit further comprises:
    a leaky cell configured to leak charge at a quicker rate than the rate at which a cell of the memory array leaks charge;
    the comparator is further configured to determine whether the leaky cell leaks to a voltage that falls outside a threshold; and
    the refresh requester is further configured to request the refresh in response to a determination of the comparator.

6. The memory device of claim 1, wherein the intermediate refresh circuit further comprises:
    a row counter to determine a time since a last refresh for a row;

the comparator is further configured to determine whether the time since the last refresh for the row is outside a time threshold; and the refresh requester is further configured to request the refresh in response to a determination of the comparator.

7. A memory device comprising:

a memory array including a plurality of memory cells, the memory array configured to be refreshed at a first refresh time interval; and an intermediate refresh circuit, the intermediate refresh circuit configured to detect a triggering event and request a refresh for a row of the memory array in response to detecting a triggering event, wherein the intermediate refresh circuit comprises:

a row access calculator, the row access calculator configured to charge a tank capacitor;

the row access calculator comprising:

an OR gate configured to provide a charge to a pulse width modulation circuit, the OR gate receiving the charge from a row access to a row of the memory array adjacent to the row access calculator;

a comparator configured to determine whether the tank capacitor is charged to a voltage that falls outside a threshold; and a refresh requester configured to request the refresh in response to a determination of the comparator.

8. The memory device of claim 7, wherein the refresh for the row of the memory array is configured to occur at a second refresh time interval, the second refresh time interval being less than the first refresh time interval.

9. The memory device of claim 7, wherein the memory array includes a dynamic random access memory (DRAM) array.

10. The memory device of claim 7, wherein the intermediate refresh circuit further comprises:

a leaky cell configured to leak charge at a quicker rate than the rate at which a cell of the memory array leaks charge;

the comparator further configured to determine whether the leaky cell leaks to a voltage that falls outside a threshold; and the refresh requester further configured to request the refresh in response to a determination of the comparator.

11. The memory device of claim 7, wherein the intermediate refresh circuit further comprises:

a row counter to determine a time since a last refresh for a row;

the comparator further configured to determine whether the time since the last refresh for the row is outside a time threshold; and the refresh requester further configured to request the refresh in response to a determination of the comparator.

* * * * *